United States Patent
Liu

(10) Patent No.: US 7,804,873 B2
(45) Date of Patent: Sep. 28, 2010

(54) ELECTRICALLY PUMPED SURFACE EMITTING ORGANIC LASER DEVICE WITH COUPLED MICROCAVITY

(75) Inventor: Xingyuan Liu, Changchun (CN)

(73) Assignee: Changchun Institute of Optics, Fine Mechanics and Physics, Chinese Academy of Sciences, Changchun (CN)

( * ) Notice: Subject to any disclaimer, the term of this patent is extended or adjusted under 35 U.S.C. 154(b) by 192 days.

(21) Appl. No.: 12/001,740

(22) Filed: Dec. 12, 2007

(65) Prior Publication Data
US 2009/0135874 A1  May 28, 2009

(30) Foreign Application Priority Data
Nov. 28, 2007  (CN) .................... 2007 1 0178312

(51) Int. Cl.
*H01S 5/00* (2006.01)
(52) U.S. Cl. .................... 372/50.11; 372/99; 372/45.01
(58) Field of Classification Search .............. 372/50.11, 372/45.01, 99
See application file for complete search history.

(56) References Cited

U.S. PATENT DOCUMENTS

| | | | |
|---|---|---|---|
| 5,881,089 A | 3/1999 | Berggren et al. | |
| 6,160,828 A * | 12/2000 | Kozlov et al. | 372/39 |
| 6,498,802 B1 * | 12/2002 | Chu et al. | 372/39 |
| 6,674,776 B2 | 1/2004 | Kahen et al. | |
| 6,853,660 B2 | 2/2005 | Spoonhower et al. | |
| 6,996,146 B1 | 2/2006 | Kahen et al. | |
| 7,242,703 B2 | 7/2007 | Forrest et al. | |
| 2006/0039432 A1 * | 2/2006 | Ha et al. | 372/45.012 |

OTHER PUBLICATIONS

R. Reufer et al., "Low-threshold polymeric distributed feedback lasers with metallic contacts", Appl. Phys. Lett. 84 (17), pp. 3262-3264, Apr. 26, 2004.
N. Tessler et al., "Lasing from conjugated-polymer microcavites", Nature 382, pp. 695-697, Aug. 22, 1996.
Ruidong Xia et al., "Fluorene-based conjugated polymer optical gain media",Org. Electron. 4, pp. 165-177, 2003.
V.G. Kozlov et al., "Study of lasing action based on Forster energy transfer in optically pumped organic semiconductor thin films", J.Appl. Phys. 84, pp. 4096-4108, Oct. 15, 1998.

(Continued)

*Primary Examiner*—Tod T Van Roy
(74) *Attorney, Agent, or Firm*—Cohen Pontani Lieberman & Pavane LLP

(57) ABSTRACT

Electrically pumped surface emitting organic laser device having a multi-layer of organic materials disposed between a highly reflective microcavity mirror and a highly reflective mirror to thereby form a coupled microcavity. More specifically, the organic laser device includes a substrate; a bottom mirror over the substrate; a layer of spacer over the bottom mirror; a coupling mirror over the spacer layer; an anode over the coupling mirror; an active layer over the anode; a cathode over the active layer; and a top mirror over the cathode. The combination of the electrode and the mirror leads to low optical absorption and highly reflective electrical contacts at organic-electrode interfaces. Electroluminescent emission efficiency is improved due to the realization of efficient electron-injection and hole-injection. A low loss organic laser device with a coupled microcavity structure is realized that can produce surface emitting laser output under electrical pumping.

19 Claims, 5 Drawing Sheets

OTHER PUBLICATIONS

T.W. Lee et al, "Low-threshold lasing in a microcavity of fluorine-based liquid-crystalline polymer blends", J.Appl. Phys. 93(3), pp. 1367-1370, Feb. 1, 2003.

M. Berggren et al., "Light amplification in organic thin films using cascade energy transfer", Nature 389, 466-469, Oct. 2, 1997.

X. Liu et al., "Low-threshold amplified spontaneous emission and laser emission in a polyfluorene derivative", Appl, Phys. Lett, 84 (15), pp. 2727-2729, Apr. 12, 2004.

S. Lattante et al., "Low electrode induced optical losses in organic active single layer polyfluorene waveguides with two indium tin oxide electrodes deposited by pulsed laser deposition", Appl. Phys. Lett. 89, pp. 031108 1-3, Jul. 17, 2006.

P. Gorm et al., "Loss reduction in fully contacted organic laser waveguides using TE2 modes", Appl. Phys. Lett. 91, pp. 041113_1-3, Jul. 23, 2007.

Michael D. McGehee et al., "Semiconducting conjugated polymers as Materials for Solid-State Lasers", Adv. Mater. 12(22), pp. 1655-1668, Nov. 16, 2000.

R.P. Stanley et al., "Coupled semiconductor microcavities", Appl. Phys. Lett. 65 (16), pp. 2093-2095, Oct. 17, 1994.

P. Bienstman et al., "The RC2LED: a novel resonant-cavity LED design using a symmetric resonant cavity in the outcoupling reflector", IEEE J. Quantum Elec. 36(6), pp. 669-673, Jun. 2000.

P. Michler et al., "Dynamics of dual-wavelength emission from a coupled semiconductor microcavity laser", Appl. Phys. Lett. 70 (16), pp. 2073-2075, Apr. 21, 1997.

L. Pavesi et al., "All-porous silicon-coupled microcvities: experiment versus theory", Phys. Rev. B 58(23), pp. 15794-15800, Dec. 15, 1998.

P.H. Berning et al., "Induced transmission in absorbing films applied to band pass filter design", J.Opt. Soc. Am. 47, pp. 230-239, 1957.

S.Y. Zheng et al., "Design of a narrow-band reflection IR multiplayer", Can. J. Phys. 61, pp. 361-368, 1983.

J.A. Dobrowolski, et al., Optical interference, contrast-enhanced electroluminescent device, Appl. Opt. 31(28), pp. 5988-5996, Oct. 1, 1992.

M. Born, et al., "Principals of Optics", Cambridge University,Cambrige, 1999.

Chun-Yu Zhang; Xing-Yuan Liu; Ge-Tao Tao; Li-Jun Wang, Optical Properties of Organic Film in a Coupled Microcavity; Source: Chinese Journal of Luminescence, vol. 28, No. 3, Published: Jun. 2007, Abstract.

Tsinghua University, Beijing Wei-Xin-Nuo Science and Technology Inc., Ltd., Published: Nov. 23, 2005, Abstract.

* cited by examiner

US 7,804,873 B2

ELECTRICALLY PUMPED SURFACE EMITTING ORGANIC LASER DEVICE WITH COUPLED MICROCAVITY

GOVERNMENT RIGHTS

The work leading to this invention was supported by the National Natural Science Foundation of China under grants 10174077, 60376029, and Jilin Province Science and Technology Research Projects 20050108. The China Government has certain rights in this invention.

BACKGROUND OF THE INVENTION

1. Field of Invention

The present invention relates to the field of light emitting devices. More specifically, the invention relates to electrical pumped organic laser devices.

2. Description of Prior Art

There has been much interest in the realization of electrically pumped organic laser devices (OLDs) as known in the art, since lasing in optically pumped organic thin films has been demonstrated using a variety of optical resonators, including optical waveguides, planar microcavities, and distributed feedback (DFB) structures (N. Tessler et al., Nature 382, 695 (1996); Ruidong Xia et al., Org. Electron. 4, 165 (2003); M. Reufer et al., Appl. Phys. Lett. 84, 3262 (2004), each of which is incorporated herein by reference). As used herein, the term "organic" includes of polymers, small molecular weight organic materials, and other kinds of organic light emitting materials that can be used to fabricate organic opto-electronic devices.

As laser gain media, organic materials are intrinsically quasi-four-level systems. They are low cost materials that have high fluorescent quantum efficiencies and low absorption losses. Optically pumped stimulated emission, gain, and lasing have been observed in various kinds of organic materials with emission wavelengths spanning the visible spectrum. It also shows that the lasing threshold, emission wavelength, output power of organic lasers have more temperature stable than conventional inorganic laser diodes. (V. G. Kozlov et al., J. Appl. Phys, 84, 4096 (1998), incorporated herein by reference). Therefore, OLDs are believed to be novel visible lasers, which show a number of applications in display, optical storage, optical communications et al.

There are some patents related to organic lasers. (U.S. Pat. No. 6,498,802, No. 6,160,828, No. 7,242,703, No. 6,853,660, No. 6,674,776, No. 5,881,089, No. 6,996,146, each of which is incorporated herein by reference). However, efforts to make electrically pumped OLDs have been unsuccessful up to now. There are still challenges to overcome such as low carrier mobility of organic films and much higher optical loss associated with electrical pumping. The low carrier mobility of organic films makes OLDs hard to achieve high current densities required, and limits the thickness of organic films to thin layers, which resulting in high optical losses in OLDs with waveguide and DFB structures. (V. G. Kozlov et al., J. Appl. Phys, 84, 4096 (1998); McGehee et al., Adv. Mater. 12, 1655 (2000), each of which is incorporated herein by reference). Recently, very low laser thresholds have been achieved in organic waveguide and microcavity structures under optical pumping, which means that electrically pumped OLDs can operate at a low current density that matching low carrier mobility of organic films. (T. W. Lee et al., J. Appl. Phys. 93, 1367 (2003); M. Berggren et al., Nature 389, 466 (1997); X. Liu et al., Appl. Phys. Lett. 84, 2727 (2004), each of which is incorporated herein by reference). Therefore, to develop an effective electrically pumped OLD, the key problem at present is how to lower the optical loss of the laser structure. (S. Lattante et al., Appl. Phys. Lett. 89, 031108 (2006); P. Görrn et al., Appl. Phys. Lett. 91, 041113 (2007), each of which is incorporated herein by reference).

One of the effective structures for electrically pumped OLD is microcavity that are formed by depositing one or multi-layer organic materials between two mirrors (either dielectric stacks or metallic) separated by a few hundred nanometers. To achieve a low threshold current, microcavity OLDs typically utilize short gain region. With such a thin gain region, microcavity OLDs have a very small single pass optical gain, thereby requiring high reflectivities equal to or greater than 97% at the interfaces between organic layers and electrodes to achieve lasing. In an electrically pumped OLD, electron carriers and hole carriers need to be injected from two electrodes, generally from an anode and a cathode, respectively. How to lower electron-injection barrier at cathode/organic interface, and hole-injection barrier at anode/organic interface is one of the critical issues for OLDs. Anode materials should employ high work function transparent conducting oxides (TCOs) such as indium tin oxide (ITO) for good hole-injection. Cathode materials should use low work function metals such as aluminum (Al), lithium (Li) or double layer structure such as Al/ITO for good electron-injection. Metal mirrors are frequently used in microcavities as they can provide suitable reflectance and excellent electrical contact. As known in the art, most thick metal mirrors have a reflectance less than 96%. However, to develop a microcavity OLD, it is essential to employ two highly reflective mirrors to construct a high quality factor (high Q) cavity. Therefore, distributed Bragg reflectors (DBRs) are the best choice among highly reflective mirrors for microcavity OLDs. In microcavity OLDs, electrodes are essentially disposed between organic layers and mirrors. In order to lower the optical absorption, microcavity OLDs should use thin and transparent electrodes. ITO film, a familiar anode, averagely has a transmittance of 85% and an absorptance of 0.5% at the thickness of 30 nm. The familiar cathode, Al metal film with the thickness of 10 nm, averagely has a transmittance of 42% and an absorptance of 37% in the visible spectra region.

To realize low loss microcavity OLDs, one challenge is how to obtain an adequate electrical contact and a reflectance equal to or higher than 97% at organic-electrode interface, especially at organic-metal interface. Another challenge is how to lower electrode-induced optical loss. There is a need, therefore for an alternative microcavity OLD that avoids these limitations.

SUMMARY OF THE INVENTION

Considering the above-mentioned problems, it is an object of this invention to provide a low-loss microcavity organic laser device arrangement that is particularly suitable to operate under electrical pumping. Organic laser device has multilayers of organic materials disposed between a highly reflective microcavity mirror and a highly reflective mirror to thereby form a coupled microcavity within a stacked arrangement. More specifically, the organic laser device of the present invention comprise a substrate; a bottom mirror over the substrate; a layer of spacer over the bottom mirror; a coupling mirror over the spacer layer; an anode over the coupling mirror; an active layer over the anode; a cathode over the active layer; and a top mirror over the cathode. The active layer of the present invention comprises an anode buffer layer, a hole-transporting layer, a gain zone, an electron-transporting layer, and a cathode buffer layer. The combination of the electrode and the mirror according to the present invention leads to low absorption and highly reflective electrical contacts at organic-electrode interfaces. Electroluminescent emission efficiency is improved due to the realization of efficient electron-injection and hole-injection. According to the present invention, a low loss organic laser device with a coupled microcavity structure is realized that can produce surface emitting laser output under electrical pumping.

ADVANTAGES

It is an advantage of the present invention that it provides for a high reflectance electrical contact at organic-electrode interface. It is a further advantage of the present invention that low loss microcavity OLDs can be achieved and emit lasing under electrical pumping.

BRIEF DESCRIPTION OF THE DRAWINGS

The above and other objects, features and advantages of the present invention will be clearer from the following detailed description about the non-limited embodiments of the present invention taken in conjunction with the accompanied drawings, in which.

DETAILED DESCRIPTION OF PREFERRED EMBODIMENTS

The present invention is directed to electrically pumped organic laser devices (OLDs) with a low loss and high Q microcavity structure. A microcavity is a resonator that has at least one dimension on the order of a single optical wavelength. The electrically pumped OLDs according to the present invention have a coupled microcavity (CMC) structure that consists of two planar Fabry-Perot microcavities. The one without organic materials is passive cavity. The other is laser cavity that has organic emitting materials inside. The two monolithic microcavities sharing a common mirror are border upon each other. Each individual cavity can support a single longitudinal mode. The mode interaction in such a coupled microcavity gives rise to a pair of optical modes, hereafter called $\lambda_L$ for "long-wavelength mode" and $\lambda_s$ for "short-wavelength mode". The intensities of the two cavity modes depend on the mismatch between the passive cavity and the laser cavity (L. Pavesi et al., Phys. Rev. B 58, 794 (1998), incorporated herein by reference). CMC structure can be considered as a special single microcavity when looking the passive cavity as a special highly reflective mirror. In this way the laser cavity is sandwiched between a highly reflective microcavity mirror and a highly reflective mirror. Compared with normal microcavity, CMC structure can significantly suppress the TE-leaky modes (R. P. Stanley et al., Appl. Phys. Lett. 65, 2093 (1994); P. Bienstman et al., IEEE J. Quantum Elect. 36, 669 (2000); P. Michler et al., Appl. Phys. Lett. 70, 2073 (1997), each of which is incorporated herein by reference). Advantageously, CMC is suitable for the formation of a low loss microcavity.

Figure 1A:
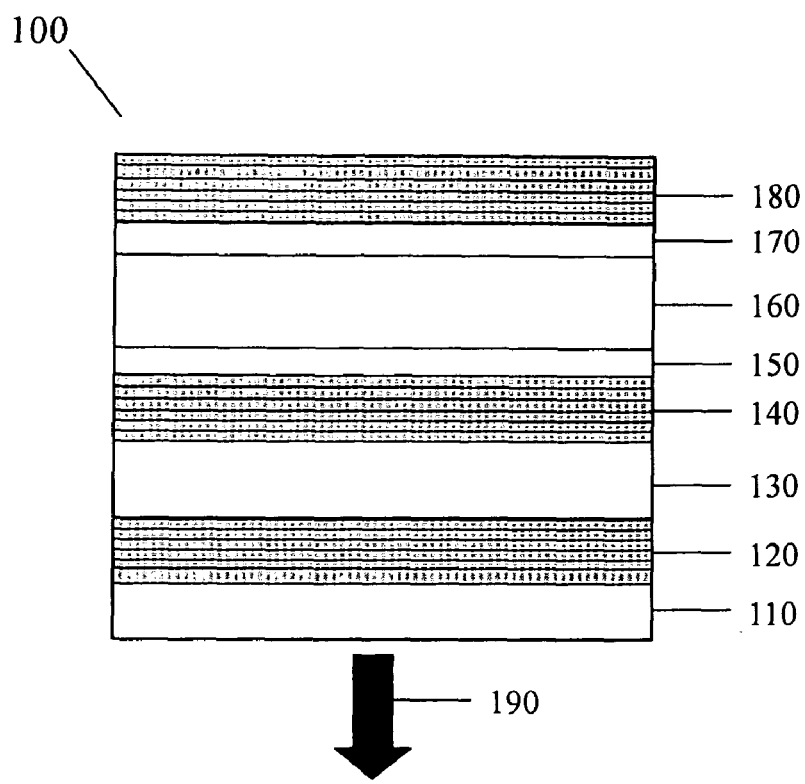
FIG. 1A shows a cross section of an electrically pumped OLD structure in accordance with an embodiment of the present invention.
Figure 1B:
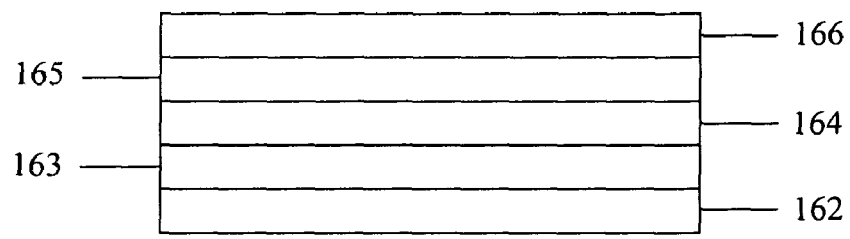
FIG. 1B shows a cross section of an active layer in accordance with an embodiment of the present invention.
Figure 1C:
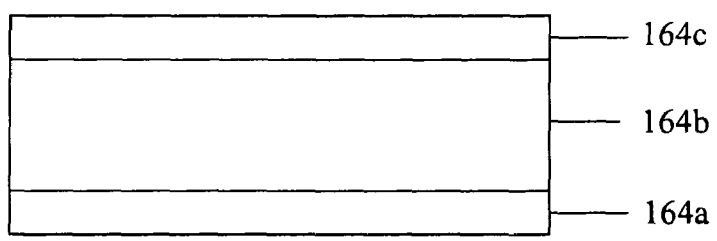
FIG. 1C shows a cross section of a gain zone in accordance with an embodiment of the present invention.

FIG. 1A shows a cross section of an electrically pumped OLD structure 100 according to the present invention. The OLD 100 is constructed of a substrate 110, a bottom mirror 120, a spacer layer 130, a coupling mirror 140, an anode 150, an active layer 160, a cathode 170, and a top mirror 180. FIG. 1B shows a cross section of an active layer 160 according to the present invention. The active layer 160 generally includes an anode buffer layer (ABL) 162, a hole-transporting layer (HTL) 163, a gain zone 164, an electron-transporting layer (ETL) 165, a cathode buffer layer (CBL) 166. FIG. 1C shows a cross section of a gain zone 164 in accordance with an embodiment of the present invention. The gain zone 164 is constructed of an electron-barrier layer (EBL) 164a, an organic gain layer (OGL) 164b, and a hole-barrier layer (HBL) 164c.

When a forward bias voltage is applied across the organic layers of the OLD 100 according to the present invention, electrons are injected into the ETL 165 from the cathode 170, and holes are injected into the HTL 163 from the anode 150. The migration of the injected charges towards the oppositely charged electrodes results in the formation of electron-hole pairs, which are typically referred to as excitons, in the gain zone 164. The photons produced by the radiative decay of excitons, can be amplified under the mechanism of stimulated emission in laser cavity. When the injection current is above the threshold current, and the optical gain is higher than optical loss, the surface emitting lasing 190 from the gain zone 164 can be output from the mirror that comparatively has a low reflectance. The OLD 100 can be top emitting or bottom emitting. As used herein, "top" means furthest away from the substrate, while "bottom" means closest to the substrate. Substrate 110 may be flexible or inflexible, and transparent or opaque. When laser emission 190 is out from the topside, the substrate 110 can either be a suitable transparent substrate such as quartz, glass, sapphire or plastic or an opaque substrate such as silicon. If laser emission 190 is out from the bottom side, the substrate 110 includes suitable materials that are substantially transparent to visible light.

The passive cavity is sandwiched between the bottom mirror 120 and the coupling mirror 140. The laser cavity is sandwiched between the coupling mirror 140 and the top mirror 180. The coupling mirror 140 is the shared mirror of the passive cavity and the laser cavity. Generally mirror 120, 140 and 180 are made up of a periodic arrangement of alternating high index and low index dielectric materials. The high-index materials can be zirconium dioxide ($ZrO_2$), tantalum pentoxide ($Ta_2O_5$), titanium dioxide ($TiO_2$), zinc sulfide (ZnS), Zinc Selenide (ZnSe), and other dielectric materials that have refractive indices more than 1.8. The low-index materials can be silicon dioxide (SiO$_2$), magnesium difluoride (MgF$_2$), lithium fluoride (LiF), yttrium fluoride (YF$_3$), barium fluoride (BaF$_2$) and other dielectric materials having refractive indices less than 1.6. The spacer layer 130 is disposed between the bottom mirror 120 and the coupling mirror 140, and can be constructed of a suitable dielectric material such as SiO$_2$. The spacer layer 130 is the cavity layer of the passive cavity that can be adjusted in thickness and refractive index so that the resulting passive cavity resonates at a desired wavelength. As the cavity length of the OLD 100 is very short in the lasing direction, increased cavity reflectance is needed to accommodate the correspondingly reduced per-pass gain. Generally, the mirror 180 and the passive cavity that are formed by the mirror 120 and the mirror 140, have a reflectance of at least 97%, preferably 99%, at the laser wavelength.

Anode 150 employs transparent conducting materials with a thickness on the order of lambda/4n or less, where lambda is the laser wavelength; n is the index of refraction of the anode 150. The suitable materials for anode 150 include indium tin oxide (ITO), zinc tin oxide (ZTO), fluorine tin oxide (FTO), and indium vanadium oxide (IVO) etc. Anode 150 is formed over the coupling mirror 140. Mirror 120, mirror 140, spacer layer 130, and anode 150 can be deposited by any suitable techniques such as plasma enhanced chemical vapor deposition (PECVD), electron-beam deposition, sputtering deposition, or thermal vapor phase deposition generally at a substrate 110 temperature higher than 200 Celsius degree. Top mirror 180 can be deposited by sputtering deposition, high-vacuum thermal evaporation or electron-beam deposition generally at a substrate 110 temperature less than 80 Celsius degree to avoid damage to organic materials.

The ABL 162 can increase planarization of the anode 150, and serve to improve film formation property of subsequent organic layers. The ABL 162 can facilitate injection of holes from the anode 150 into the HTL 163. Suitable materials for use in ABL 162 include, but are not limited to, a triarylamine derivatives doped with an organic electron acceptor material, and inorganic oxides such as vanadium oxide (VO$_x$), molybdenum oxide (MoO$_x$), nickel oxide (NiO$_x$), and tungsten oxide (WO$_x$), etc. The HTL 163 facilitates the migration of holes towards the gain zone 164. HTL 163 can be one layer or multilayers. HTL 163 may be intrinsic (undoped) organic materials, or doped ones that can be used to enhance conductivity. The HTL 163 can include, for example, triaryl amines derivatives or other suitable materials as known in the art, such as N,N'-bis(3-naphthalen-2-yl)-N,N'-bis(phenyl)benzidine (NPD),
4,4',4"-tris(N-naphthyl-N-phenylamino)triphenylamine (2T-NATA),
4,4',4"-tris[(3-methylphenyl)phenylamino]triphenylamine (m-MTDATA),
poly(N-vinylcarbazole) (PVK),
poly(3,4-ethylenedioxythiophene)/poly(4-styrenesulfonate) (PEDOT/PSS), etc.

The gain zone 164 is disposed between HTL 163 and ETL 165. FIG. 1C depicts a gain zone 164 consisting of an organic gain layer (OGL) 164b sandwiched between an electron-barrier layer (EBL) 164a, and a hole-barrier layer (HBL) 164c. EBL 164a, which is optional and used as a barrier for the passage of electrons to the anode 150, can limit electrons within the gain zone 164. EBL 164a can include suitable organic materials and inorganic materials having a large bandgap such as LiF and YF$_3$. HBL 164c, which is optional and used as a barrier for the passage of holes to the cathode 170, can limit holes within the gain zone 164. HBL 164c can include suitable organic materials such as bis(2-methyl-8-quinolinolato)(4-phenylphenolato)Aluminum(III) (BALQ), 2,9-dimethyl-4,7-diphenyl-phenanthroline (BCP), and other suitable organic materials as known in the art. HBL 164c can also include inorganic materials having a large bandgap such as LiF and YF$_3$. The EBL 164a and HBL 164c may also be used to block excitons from diffusing out of the gain zone 164. OGL 164b can be one layer or multi-layers. OGL 164b generally includes one or a plurality of host materials doped with one or a plurality of guest dopants. A suitable host material can efficiently transfer energy to a highly luminescent guest dopant. Host materials can include, BCP, 4,4'-N,N'-dicarbazole-biphenyl (CBP), tris(8-hydroxyquinolato)aluminum (ALQ), and other suitable materials as known in the art. Guest dopants can be selected from highly fluorescent dyes or highly phosphorescent dyes such as 3-(2'-benzothiazolyl)-7-(diethylamino)coumarin (Coumarin 6),
4-dicyanomethylene-2-methyl-6-p-dimethylaminostyryl-4H-pyran (DCM),
Rubrene,
Perylene,
10-(2-benzothiazolyl)-1,1,7,7-tetramethyl-2,3,6,7-tetrahydro-1H, 5H, 11H-[1]benzo-pyrano[6,7,8-ij]quinolizin-11-one (C545T),
4-(Dicyanomethylene)-2-tert-butyl-6-(1,1,7,7-tetramethyl-julolidin-4-yl-vinyl)-4H-pyran (DCJTB), and other suitable materials as known in the art. OGL 164b can also comprise a single organic material, such as poly(p-phenylenevinylene) (PPV) derivatives, polyfluorene (PF) derivatives, etc.

ETL 165 facilitates the migration of electrons towards the gain zone 164. ETL 165 can be one layer or multilayers. ETL 165 can include, for example, ALQ, 3-(4-biphenylyl)-4-phenyl-5-(4-tert-butyl phenyl)-1,2,4-triazole (TAZ), 1,3-bis(N,N-t-butyl-phenyl)-1,3,4-oxadiazole (OXD-7), 2,9-dimethyl-4,7-diphenyl-phenanthroline (BCP), and other suitable materials as known in the art. CBL 166 can serve to facilitate injection of electrons from the cathode 170 into the ETL 165. Suitable materials for use in CBL 166 include, but are not limited to, alkaline or alkaline earth metal doped organic layers, alkali halide salts, rare-earth fluoride, and transition element fluoride, such as LiF, YF$_3$, and BaF$_2$, etc. The cathode 170 is formed over CBL 166. Desirable materials of the cathode 170 are metal materials having a low work function (<4.0 eV) and good film-forming properties to ensure good contact with the underlying organic layer, such as aluminum (Al), lithium (Li), silver (Ag), calcium (Ca), magnesium (Mg), and combinations or alloys of these materials. The organic and metal materials used in the present invention can be deposited by any suitable technique, such as by vacuum thermal evaporation.

Generally for a thin metal film, the sum-up of its transmittance T, reflectance R, and absorptance A is unity, i.e. A+R+T=1. According to the principle of induced transmission filter first described by Berning and Turner, the absorbance of a metal film is not solely a function of its optical parameters but can depend very significantly on the optical environment of that film. (P. H. Berning et al., J. Opt. Soc. Am. 47, 230 (1957). S. Y. Zheng et al., Can. J. Phys. 61, 361 (1983). Dobrowolski J. A. et al., Appl. Opt. 31, 5988 (1992), incorporated herein by reference). By the proper design of multilayer coatings on thin metal film, absorptance or reflectance can be enhanced or eliminated due to optical interference over a specified wavelength region. This principle has been used to increase the contrast ratios of display devices, and can also be used to construct a high reflective electrical contact with a low absorption.

The cathode 170 of the present invention employs metal film with a thickness of about 5-15 nm. It is found that a cathode 170 combined with a suitable top mirror 180 can provide an integrated optical and electrical performance such as a high reflectance and a low absorption at a certain wavelength. Because the lower absorptance is associated with the higher reflectance, the optical loss from cathode 170 can be sufficiently reduced with a highly reflective top mirror 180. Experiments show that such a structure can form a good electrical contact at the active layer 160/the cathode 170 interface.

A standing wave electromagnetic field with periodic intensity maxima and minima is established in the laser cavity. The overall thickness of active layer 160 is adjusted so that the cavity length of the laser cavity equals to an integral number of half wavelength of the laser emission. The interfaces at active layer 160/anode 150 and at active layer 160/cathode 170 are positioned near the standing wave minima, while the gain zone 164 is disposed at positions corresponding with the antinodes of the standing wave. This arrangement can further lower the optical absorption at lasing wavelength from the anode 150 and cathode 170, and significantly increase the microcavity effect of the OLD 100 due to Purcell effect. Electrically pumped OLDs 100 according to the present invention can emit a circularly symmetric laser beam in a direction perpendicular to the substrate. Electrically pumped OLDs 100 of the present invention can be fabricated in extremely small sizes, and readily made into two-dimensional laser arrays. Electrically pumped OLDs 100 of the present invention have various applications including laser sources, integrated optoelectronic circuits, optical interconnection, optical computing, optical switching, image processing, sensing, spectroscopy, and optical memory.

Example 1

As one example of the embodiment shown in FIG. 1, the OLD 100 was prepared over a glass substrate 110 by depositing the bottom mirror 120. Then a λ/2-thick $SiO_2$ layer was deposited onto the bottom mirror 120 using as the spacer layer 130, followed by a coupling mirror 140. The bottom mirror 120 and the coupling mirror 140 are comprised of λ/4-thick $TiO_2/SiO_2$ layers with 4.5 pairs and 4 pairs, respectively. The designed Bragg wavelength A for the passive cavity is 595 nm. On top of the coupling mirror 140, an ITO layer with the thickness of 54 nm was deposited as the anode 150. The $TiO_2$, $SiO_2$, and ITO films were deposited by electron beam evaporation at a substrate temperature of 200 Celsius degree in an oxygen pressure of $2 \times 10^{-2}$ Pa. The following layers were deposited in the following sequence by thermal evaporation or sublimation under a vacuum of $5 \times 10^{-4}$ Pa: 1) the ABL 162 layer over the ITO, 1 nm thick, including $MoO_3$; 2) a HTL 163 layer, 17 nm thick, including 2T-NATA; 45 nm thick, including NPB; 3) the OGL 164b layer, including 35 nm of NPB doped with ca. 1.5 wt. % DCM, and 40 nm of ALQ doped with ca. 2 wt. % DCM; 4) the ETL 165 layer, including 58 nm of ALQ; 5) the CBL 166 layer, including 1 nm of LiF; 6) the cathode 170, including about 10 nm of Al. After the deposition of these layers, the top mirror 180 were deposited over the cathode 170 (Al layer), which consisting of 7.5 pairs of $ZnS/MgF_2$ quarter-wave layers, and is designed to offer a maximum reflectance of 99.5% at 590 nm. The ZnS and $MgF_2$ layers were deposited in a vacuum of $1 \times 10^{-3}$ Pa by electron beam evaporation with a substrate temperature less than 80 Celsius degree to avoid damage to organic layers. OLD 100 constructions can be denoted as Glass substrate/bottom mirror/$SiO_2$/coupling mirror/ITO (54 nm)/$MoO_3$ (1 nm)/2T-NATA (17 nm)/NPB (45 nm)/NPB:DCM (35 nm)/ALQ:DCM (40 nm)/ALQ (58 nm)/LiF (1 nm)/Al (10 nm)/top mirror.

Figure 2:
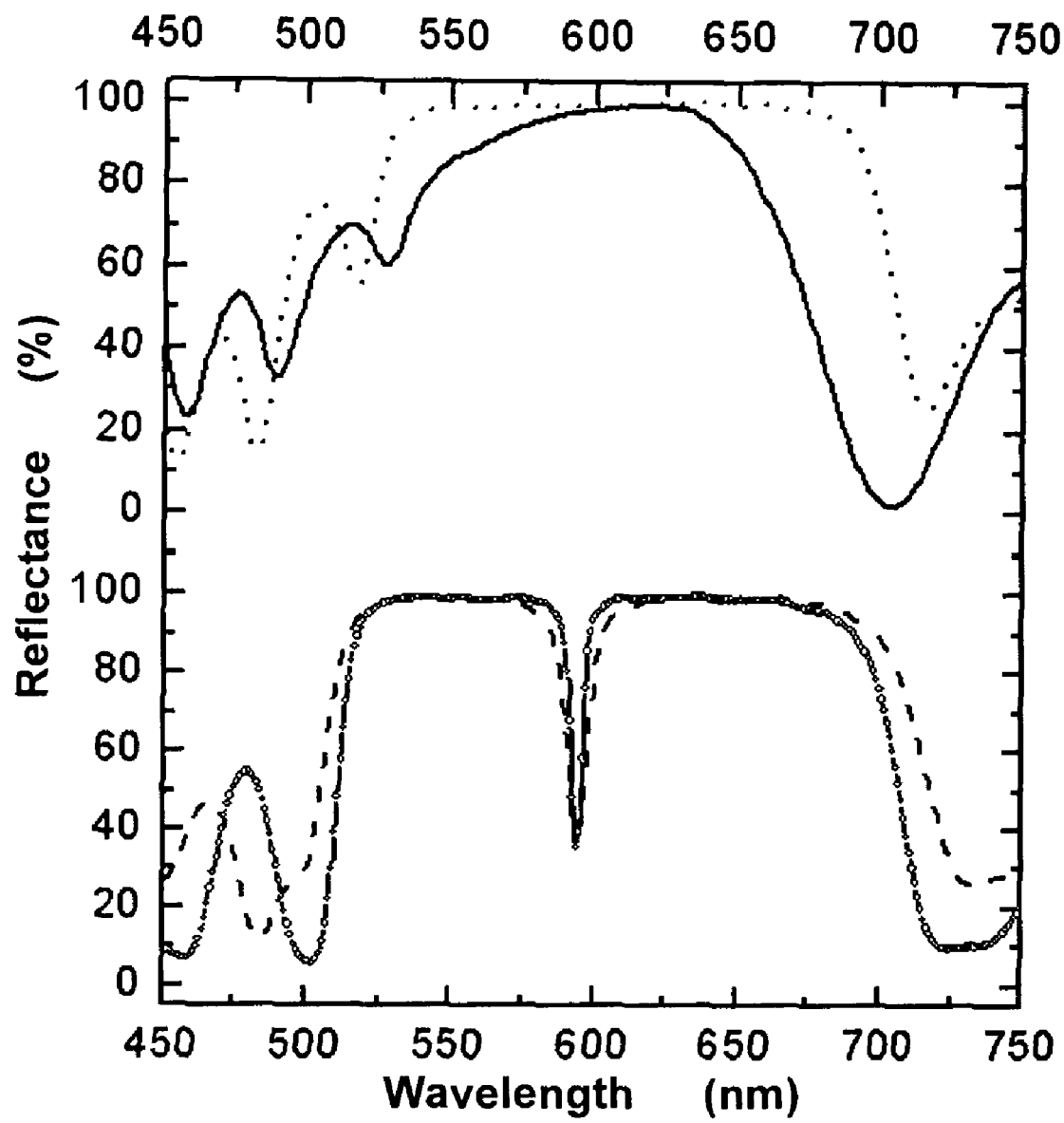
FIG. 2 shows the measured reflectance spectra of a top mirror (dot) and a thin metal cathode combined with the top mirror (line); the measured reflectance spectra of passive cavity (dash) and an anode combination with a structure of glass/passive cavity/ITO (open circle) in accordance with an embodiment of the present invention.

The OLD 100 samples were electrically pumped by a semiconductor parameter analyzer that can generate full wave rectified sinusoidal pulse waveform at a repetition rate of 100 Hz. EL spectra and reflectance spectra were measured with an Avantes fiber optic spectrometer normal to the OLD 100 surface. FIG. 2 shows the measured reflectance spectra of the top mirror 180 (dot) and the Al cathode 170 combined with the top mirror 180 (line) for one embodiment of the present invention. It shows that compared with single Al thin film, the Al cathode 170 and the top mirror 180 combination system shows an increase in reflectance due to optical interference effect. The maximum reflectance greater than 99% come around 618 nm, which means that a minimum absorptance less than 1% can be obtained at the same wavelength. In contrast to the top mirror 180, the cathode 170 in combination with the top mirror 180 has a narrowed high reflective stop band and a red shift reflective peak, which can be optimized to locate at the desired wavelength by proper structure design. FIG. 2 also shows the measured reflectance spectra of passive cavity (dash) and the anode 150 combination structure of glass/passive cavity/ITO (open circle) in accordance with an embodiment of the present invention. The resonance peak of the passive cavity is about 595 nm. The reflectance in the stop band is greater than 99%, which changed little when capped with the ITO anode 150. In the OLD 100, the Bragg wavelength λ designed for the laser cavity is about 600 nm, which is red shift in contrast to that of the passive cavity. The overall thickness of organic layers is selected to form λ/2 laser cavity with the OGL 164b layer situated around the antinode and the two organic layer/electrode interfaces located near the node of the confined cavity electromagnetic field.

Figure 3:
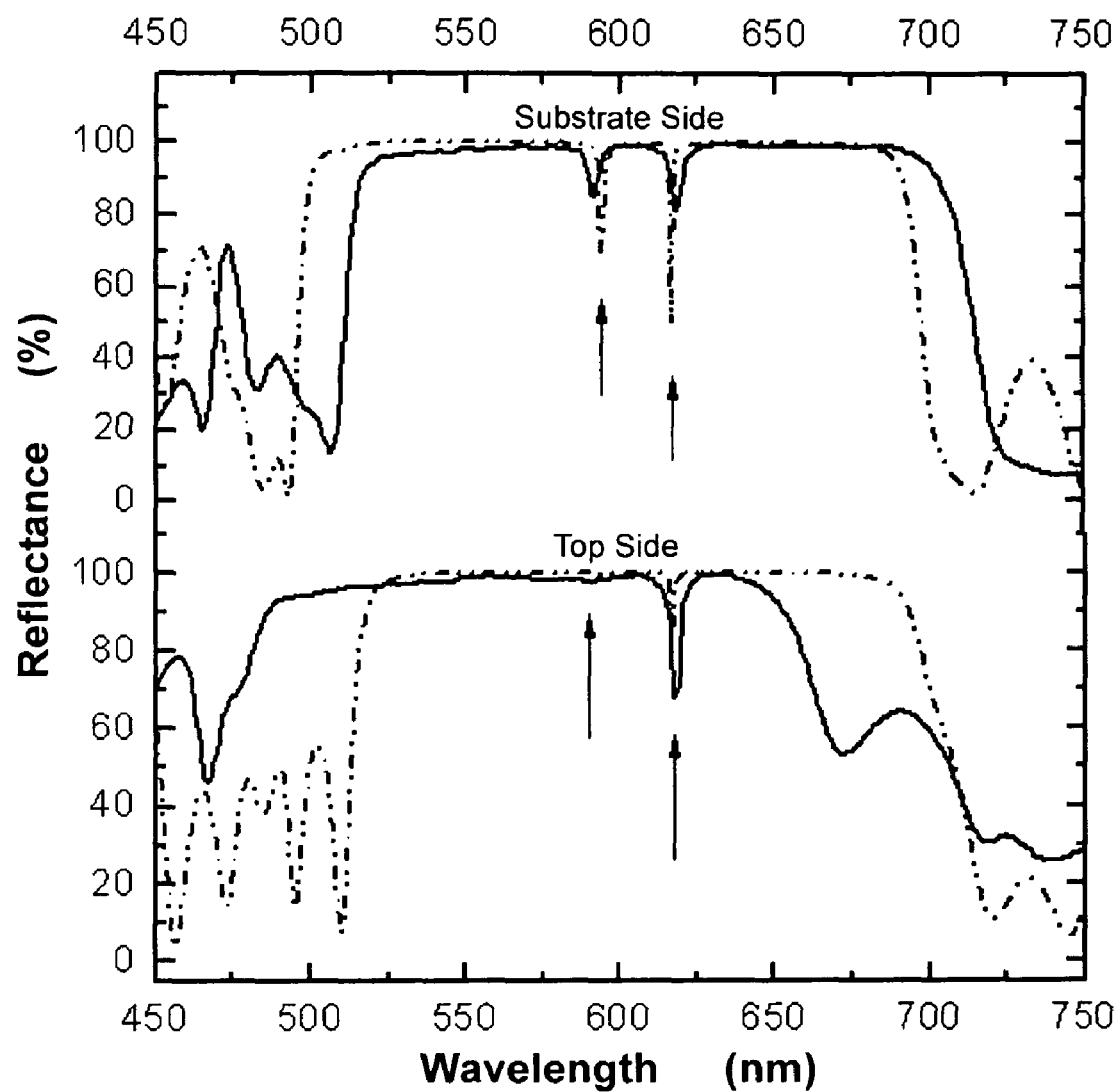
FIG. 3 Measured reflectance spectra (line) of the OLD from the substrate side and the top side compared with the modeled reflectance spectra (dot) in accordance with an embodiment of the present invention. The arrows point to the cavity modes.

FIG. 3 shows measured reflectance spectra (line) of the OLD 100 from the substrate side and the top side compared with the modeled reflectance spectra (dot) by a transfer matrix method (M. Born, et al., "Principles of Optics", Cambridge University, Cambridge, 1999) in accordance with an embodiment of the present invention. The arrows point to the cavity modes. Two coupled cavity modes can be observed in the passive cavity with a short-wavelength mode locates at $\lambda_s$=591 nm and long-wavelength mode $\lambda_L$ 618 nm. While in the laser cavity the mode around 591 nm is too weak. Only the cavity mode at 618 nm can be clearly observed.

Figure 4:
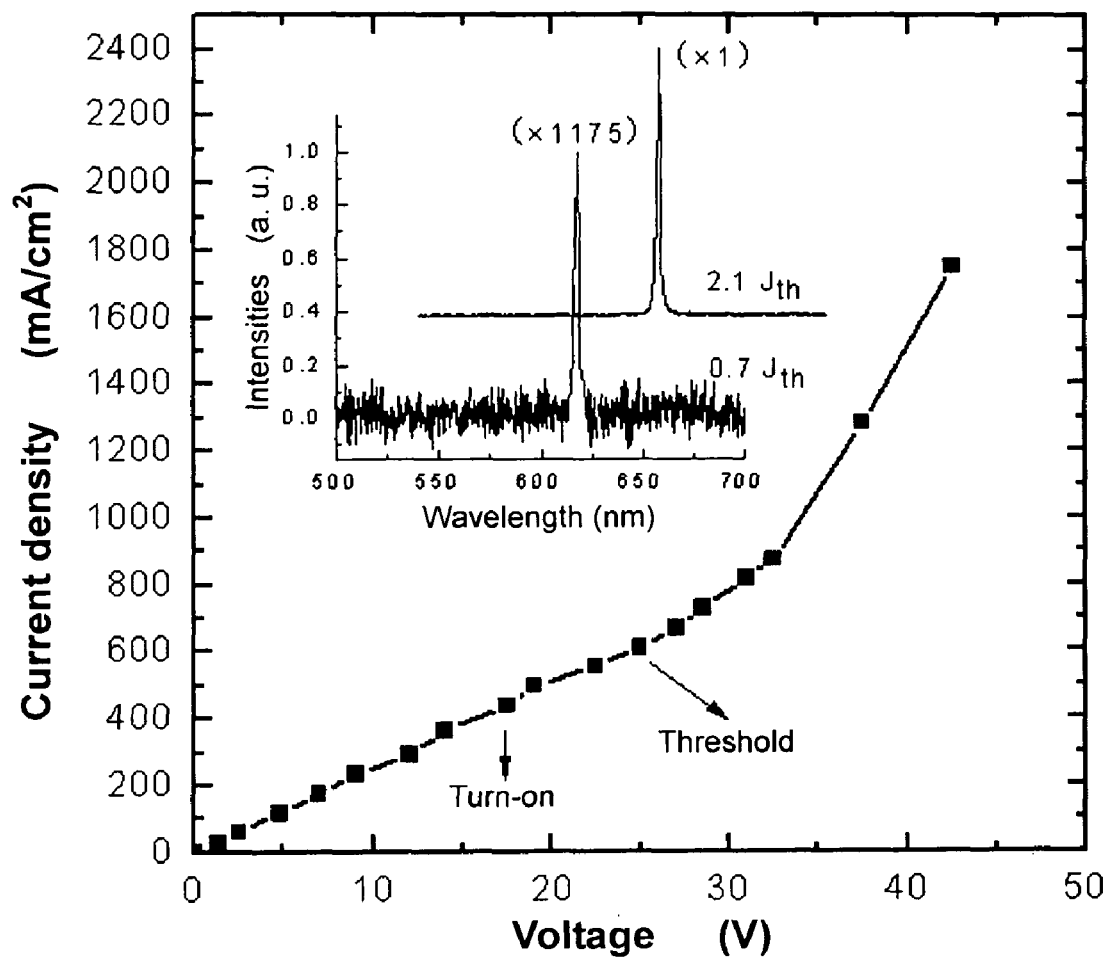
FIG. 4 shows current density versus bias voltage in accordance with an embodiment of the present invention. The inset shows emission spectra below and above threshold, measured with a 15° full angle acceptance cone. $J_{th}$ is the current density at threshold.
Figure 5:
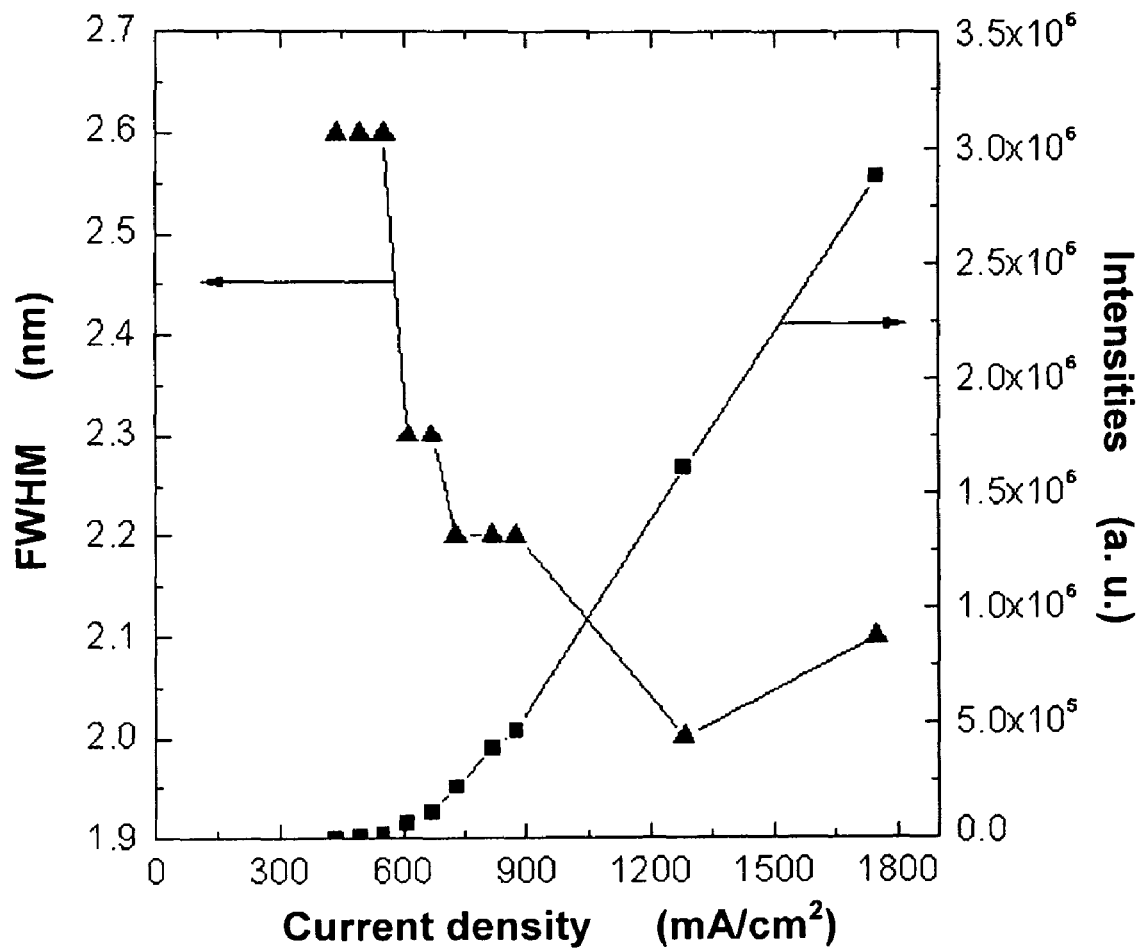
FIG. 5 shows FWHM and emission intensity of EL spectra as a function of injection current density in accordance with an embodiment of the present invention. Emission intensity obtained is spectrally integrated between 605 nm and 631 nm.

FIG. 4 shows current density of the OLD 100 as a function of the voltage in accordance with an embodiment of the present invention. It shows that the current density increases linearly with voltage over the voltage range from 0 V to 32 V, indicating that good electrical contacts are formed in the interfaces between active layer 160/anode 150 and active layer 160/cathode 170. In the OLD 100, light emission was not output until injection current density reached a value of about 430 mA/cm², corresponding to a turn-on voltage of 17 V. The lasing is out from the top side. FIG. 5 shows the full width at half maximum (FWHM) and emission intensity of EL spectra as a function of injection current density in accordance with an embodiment of the present invention. Emission intensity obtained is spectrally integrated between 605 nm and 631 nm. A clear laser threshold behavior is observed at the threshold current density ($J_{th}$) of 612 mA/cm², above which integration intensity has a sharp increase, and FWHM decreases from 2.6 nm to 2.0 nm. The inset in FIG. 4 shows emission spectra of the OLD 100 below and above threshold, measured with a 15° full angle acceptance cone. The emission spectrum below the $J_{th}$ is dominated by a single cavity mode at 618 nm with a FWHM of 2.6 nm, which corresponds to a cavity quality factor Q=237. At current density of about 1283 mA/cm², an average output power of 572 nW was obtained at the lasing wavelength of 618 nm.

Example 2

An OLD 100 is constructed in the manner described in Example 1, except the following changes. The substrate 110 is silicon. The bottom mirror 120 and the coupling mirror 140 are comprised of λ/4-thick $Ta_2O_5/SiO_2$ layers with 5.5 pairs and 4 pairs, respectively. The spacer layer 130 used is a λ/2-thick $SiO_2$ layer. The top mirror 180 consists of 7.5 pairs λ/4-thick $ZnS/MgF_2$ layers. The designed Bragg wavelength λ for all the mirrors is 500 nm. The ABL 162 layer including $VO_x$. Both the EBL 164a layer and the HBL 164c layer are using 0.3 nm of LiF. The OGL 164b layer, including 30 nm of NPB doped with ca. 1 wt. % C545T, and 45 nm of ALQ doped with ca. 1.5 wt. % C545T. The CBL 166 layer including 1 nm of $YF_3$. The cathode 170 layer is a 10:1 atomic ratio of magnesium and silver film (MgAg). The cathode 170 layer capped with the top mirror 180 has a reflectance of 99% at the wavelength of 515 nm. The completed OLD 100 structure can be denoted as Si substrate/bottom mirror/$SiO_2$/coupling mirror/ITO (43 nm)/$VO_x$ (1 nm)/NPB (47 nm)/LiF (0.3 nm)/NPB:C545T (30 nm)/ALQ:C545T (45 nm)/LiF (0.3 nm)/ALQ (42 nm)$YF_3$ (1 nm)/MgAg (10 nm)/Top mirror. A Keithley 2400 source meter was used to measure the current-voltage characteristics. The lasing output could be obtained from the topside with an emission wavelength of 516 nm and a FWHM of 1 nm. The threshold current density is 892 mA/cm².

Example 3

An OLD 100 is constructed by a glass substrate 110. The bottom mirror 120 and the coupling mirror 140 are comprised of λ/4-thick $Ta_2O_5/SiO_2$ layers with 4.5 pairs and 4 pairs, respectively. The spacer layer 130 used is a λ/2-thick $SiO_2$ layer. The top mirror 180 consists of 9.5 pairs λ/4-thick $ZnSe/YF_3$ layers. The designed Bragg wavelength λ for all the mirrors is 645 nm. The ABL 162 layer including $VO_x$. Both the EBL 164a layer and the HBL 164c layer are using 0.2 nm of $YF_3$. The OGL 164b layer, including 36 nm of NPB doped with ca. 1 wt. % DCJTB, and 40 nm of ALQ doped with ca. 2.5 wt. % DCJTB. The completed OLD 100 structure can be denoted as Glass substrate/bottom mirror/$SiO_2$/coupling mirror/ITO (58 nm)$NO_x$ (1 nm)/NPB (60 nm)/$YF_3$ (0.2 nm)/NPB: DCJTB (36 nm)/ALQ: DCJTB (40 nm)/$YF_3$ (0.2 nm)/ALQ (61 nm)/LiF (1 nm)/Al (10 nm)/Top mirror. A Keithley 2400 source meter was used to measure the current-voltage characteristics. The lasing output could be obtained from the substrate 110 side with two cavity modes at 635 nm and 651 nm. The threshold current density is 1439 mA/cm².

The above embodiments are provided for the purpose of example only, and are not intended to limit the present invention. It is to be understood by those skilled in the art that there may be various modifications or replacements to the embodiments without departing from the scope and the spirit of the present invention, and they shall fall into the scope defined by the appended claims.

PARTS LIST 100 organic laser diode
110 substrate
120 bottom mirror
130 spacer layer
140 coupling mirror
150 anode
160 active layer
162 anode buffer layer
163 hole-transporting layer
164 gain zone
164a electron-barrier layer
164b organic gain layer
164c hole-barrier layer
165 electron-transporting layer
166 cathode buffer layer
170 cathode
180 top mirror

What is claimed is:

1. An organic laser device comprising:
   a substrate;
   a bottom mirror formed by a distributed Bragg reflector over the substrate;
   a spacer layer over the bottom mirror;
   a coupling mirror formed by a distributed Bragg reflector over the spacer layer;
   an anode over the coupling mirror;
   an active layer that includes:
     an anode buffer layer above the anode;
     a hole-transporting layer above the anode buffer layer;
     a gain zone above the hole-transporting layer;
     an electron-transporting layer above the gain zone; and
     a cathode buffer layer above the electron-transporting layer;
   a cathode layer over the active layer; and
   a top mirror formed by a distributed Bragg reflector over the cathode.

2. The organic laser device of claim 1, wherein the gain zone comprises an organic gain layer, or an electron-barrier layer and an organic gain layer, or an organic gain layer and a hole-barrier layer, or an electron-barrier layer, a hole-barrier layer, and an organic gain layer sandwiched between the electron-barrier layer and the hole-barrier layer.

3. The organic laser device of claim 2, wherein the electron-barrier layer and the hole-barrier layer are composed of suitable organic materials or inorganic materials having a large bandgap.

4. The organic laser device of claim 2, wherein the organic gain layer is one layer or multi-layers, the organic gain layer comprises a single material, or includes one or a plurality of suitable host materials doped with one or a plurality of suitable guest dopants.

5. The organic laser device of claim 4, wherein the host materials are able to efficiently transfer energy to a highly luminescent guest dopant, and the guest dopants are highly fluorescent dyes or highly phosphorescent dyes.

6. The organic laser device of claim 1, wherein a passive cavity is sandwiched between the bottom mirror and the coupling mirror, and a laser cavity is sandwiched between the coupling mirror and the top mirror, and a coupled microcavity is formed by the passive cavity and the laser cavity through the shared coupling mirror.

7. The organic laser device of claim 6, wherein the passive cavity and the top mirror have a reflectance of at least 97% at the laser wavelength.

8. The organic laser device of claim 7, wherein the passive cavity and the top mirror have a reflectance of at least 99% at the laser wavelength.

9. The organic laser device of claim 6, wherein the combination of the anode and the passive cavity leads to the combination of low optical absorption and a highly reflective electrical contact at active layer/anode interface.

10. The organic laser device of claim 1, wherein the overall thickness of the active layer is adjusted so that the cavity length of the laser cavity equals to an integral number of half wavelength of the laser emission.

11. The organic laser device of claim 1, wherein the gain zone is aligned with the antinodes of the laser cavity's standing wave electromagnetic field.

12. The organic laser device of claim 1, wherein the interfaces at active layer/anode and at active layer/cathode are aligned with the nodes of the laser cavity's standing wave electromagnetic field.

13. The organic laser device of claim 1, wherein the combination of the cathode and the top mirror leads to the combination of low optical absorption and a highly reflective electrical contact at active layer/cathode interface.

14. The organic laser device of claim 1, wherein the bottom mirror, the spacer layer, the coupling mirror, and the anode are deposited by any suitable techniques selected from plasma enhanced chemical vapor deposition (PECVD), electron-beam deposition, sputtering deposition, or thermal vapor phase deposition.

15. The organic laser device of claim 1, wherein the top mirror is deposited by sputtering deposition, high-vacuum thermal evaporation or electron-beam deposition.

16. The organic laser device of claim 1 wherein the organic laser device operating under forward bias voltage, emits a circularly symmetric laser beam in a direction perpendicular to the substrate.

17. The organic laser device of claim 1, wherein the organic laser device is able to emit lasing beam from the substrate side or the reverse side.

18. The organic laser device of claim 1, wherein the organic laser device is able to realize single wavelength lasing emission, or dual-wavelength lasing emission.

19. The organic laser device of claim 1, wherein the organic laser device is able to be fabricated in an extremely small size, and readily made into two-dimensional laser arrays.

* * * * *